United States Patent
Bergstedt et al.

(10) Patent No.: US 6,951,797 B1
(45) Date of Patent: Oct. 4, 2005

(54) METHOD RELATING TO ANODIC BONDING

(75) Inventors: Leif Bergstedt, Sjömarken (SE); Gert Andersson, Lindome (SE); Britta Ottosson, Mölndal (SE)

(73) Assignee: Imego AB, Gothenburg (SE)

( * ) Notice: Subject to any disclaimer, the term of this patent is extended or adjusted under 35 U.S.C. 154(b) by 251 days.

(21) Appl. No.: 10/111,138

(22) PCT Filed: Oct. 17, 2000

(86) PCT No.: PCT/SE00/02012

§ 371 (c)(1),
(2), (4) Date: Aug. 6, 2002

(87) PCT Pub. No.: WO01/29890

PCT Pub. Date: Apr. 26, 2001

Related U.S. Application Data

(60) Provisional application No. 60/160,411, filed on Oct. 19, 1999.

(30) Foreign Application Priority Data

Oct. 19, 1999 (SE) .................................. 9903798

(51) Int. Cl.⁷ .................... H01L 31/00; H01L 27/14
(52) U.S. Cl. .................. 438/455; 438/456; 438/466; 257/414
(58) Field of Search ..................... 438/455, 556, 438/466, 456; 257/414

(56) References Cited

U.S. PATENT DOCUMENTS

| | | | |
|---|---|---|---|
| 4,291,293 A | | 9/1981 | Yamada et al. |
| 4,746,893 A | | 5/1988 | Shak |
| 5,095,752 A | * | 3/1992 | Suzuki et al. ............ 73/514.32 |
| 5,412,867 A | * | 5/1995 | Aikawa et al. ............... 29/825 |
| 5,591,679 A | * | 1/1997 | Jakobsen et al. ............. 438/51 |
| 5,837,562 A | * | 11/1998 | Cho ............................. 438/51 |
| 6,548,322 B1 | * | 4/2003 | Stemme et al. ............... 438/57 |

FOREIGN PATENT DOCUMENTS

| | | | |
|---|---|---|---|
| EP | 0742581 A | 11/1996 | |
| JP | 7086313 A | 3/1995 | |
| JP | 10256285 A | 9/1998 | |

* cited by examiner

Primary Examiner—T. N. Quach
(74) Attorney, Agent, or Firm—Michael J. Brown

(57) ABSTRACT

The present invention relates to a method of bonding a first member (110, 210, 130, 230, 410, 430, 510, 530, 610) to a second silicon member (120, 220, 420a, 420b, 600) through anodic bonding. The method comprises the steps of selectively depositing on said first member bondable sections (170a, 170b, 270, 470a, 470b, 470c, 570, 620) before bringing said first and second members together for anodic bonding.

19 Claims, 3 Drawing Sheets

METHOD RELATING TO ANODIC BONDING

TECHNICAL FIELD OF THE INVENTION

The present invention relates to a method of bonding at least a first member to a second silicon member through anodic bonding.

BACKGROUND OF THE INVENTION

EP 742 581, for example, relates to a method of making sealed cavities on silicon wafer surfaces by anodic bonding and with electrically insulated conductors through the sealing areas to connect functional devices inside the cavities to electrical terminals outside said cavities. The conductors are provided through the use of doped buried crossings in a single crystal silicon substrate, thereby also allowing production of different kinds of integrated silicon devices, e.g. sensors.

The technique implies that Borosilicate glass plates are bonded onto a silicon (Si) wafer using so-called anodised bonding. A plate of glass is arranged on a Si wafer under an amount of pressure. The Si wafer and the glass are then heated up to some hundred degrees and a voltage is applied across the plates (glass and wafer) whereby the glass, which contains sodium (Na) ions migrate into the Si wafer, and a hermetic junction is obtained.

When two Si wafers are to be connected, a similar method as mentioned above is carried out, however, one of the wafers is coated with sputtered borosilicate glass and an anodised bonding is performed.

Generally, to be able to achieve an anodised bonding the object intended to be bonded to Si must contain Na-ions, usually through doping a glass with Soda lime glass. The reason for using borosilicate glass is that it matches the Si wafer characteristics, specially with respect to coefficient of expansion.

One major problem related to above mentioned and similar methods is the possibility of providing a conducting arrangement through the glass or wafer. In above mentioned European Patent No. 742 581, for example, the electrical connection path is from one of an outside wire bonding area via a first contact diffusion down to a buried conductor which crosses below the sealing area of the cavity, and via a second contact diffusion to a second aluminium interconnection line which establishes connections to two piezoresistors.

SUMMARY OF THE INVENTION

The main object of the present invention is to provide a method of providing a hermetical sealing between a first substrate and a silicon substrate.

Another object of the present invention is to achieve a hermetical sealing through selective deposition of bondable surfaces on a first substrate and the silicon substrate. Yet another object of the invention is to provide electrical connection between the sealed space and the outside environment through or under the sealing section.

For these reasons, the initially mentioned method comprises the steps of selectively depositing on said first member at least one bondable section before bringing said first and second members together for anodic bonding.

Preferably, the first member is a glass wafer, specially a borosilicate glass wafer and said second wafer is a silicon wafer or the first member is a carrier wafer specially one of glass, ceramics or glass composite, such as LTCC (Low Temperature Cofired Ceramic) and said second wafer is a silicon wafer. The bondable section comprises a paste containing Na ions.

Preferably, the selective deposition is provided through screen printing or photo image forming.

Most preferably, depending on the function of the circuitry the bonding is hermetical.

Preferably, said first member comprises of a cover, that said second silicon member is a carrier for a functional device and said first member bonded to said second member provides a sealing for said functional device. Moreover, a third member is arranged as a carrying member for supporting said second member.

In one embodiment, electrical connections are arranged out of said cover through said bonding sections and/or said third supporting member.

Preferably, said connections through said bonding sections are arranged on one of said first, second or third members before applying the bonding paste. The bonding sections are provided on said first member.

According to the invention, a method of selectively bonding a first member to a second silicon member through anodic bonding is provided, wherein the method comprises the steps of: providing the said first and second members, arranging said first member with bonding sections in predetermined sections, arranging said first and second members in a contacting position, pressing and heating said first and second members in said contacting position, and applying a voltage to said first and second members. Preferably, the second member is a silicon wafer comprising one or more active sections. The first member is a glass wafer provided with frames corresponding to said active sections.

The invention also concerns a sensor comprising a lid, a silicon substrate and a carrying substrate, wherein said lid, silicon substrate and carrying substrate are bonded through the method f the invention.

The invention also concerns a biological circuit hermetically connected to a substrate using the method f the invention.

BRIEF DESCRIPTION OF THE DRAWINGS

In the following, the invention will be further described in a non-limiting way with reference to the accompanying drawings in which.

DETAILED DESCRIPTION OF THE EMBODIMENTS

According to one preferred embodiment paste, e.g. of thick or thin film is through, e.g. screen printing or photo image forming, with doping containing Na ions, provided with conductive and non conductive sections which are bondable through anodic bonding. The carrier section may be one of glass, ceramics or glass composite, such as LTCC (Low Temperature Cofired Ceramic).

There are a number of different thick-film pastes with different glass mixtures. It is also possible to produce pastes with sodium or soda-lime content, both as dielectric and conductive pastes. However, the object of these is to provide a glass composition which matches the substrate to be printed.

Figure 1:
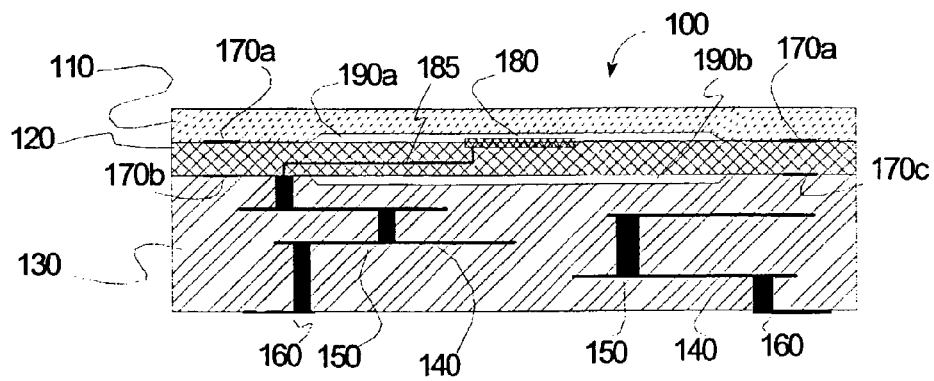
FIG. 1 schematically illustrates an arrangement produced according to the teachings of the invention.

FIG. 1 is a cross section through a device 100, e.g. a sensor according to above mentioned sensor of EP 742 581. The device comprises a cover or lid 110, e.g. of borosilicate glass or other glass composition, a semiconducting wafer 120, a substrate 130, preferably a multi layer substrate including conductors 140 and vias 150 arranged therein and solder pads 160. The lid 110 is bonded to the Si wafer 120 through bonding areas 170a, provided in accordance with the teachings of the present invention. The substrate 130 is also bonded to the Si wafer 120 through bonding areas 170b, provided in accordance with the teachings of the present invention. The bonding areas 170 and 170b are provided as a paste on the lid 110 and carrier substrate 130, respectively, as closed frames through screen printing and/or photo image forming or the like.

The electronic circuitry or functional devices 180 arranged on the silicon (Si) wafer 120 are connected to the conductors 140, e.g. through connections 185 via the Si wafer. It is also possible to arrange connections that pass the bonding paste of the connection areas 170a and/or 170b, which will be exemplified in the following embodiments. The electronic circuitry 180 is further connected to other circuits through solder pads 160.

In a sensor, filter or similar applications both the lid 110 and the substrate 130 can be provided with cavities 190a and 190b, respectively.

Figures 2A, 2B:
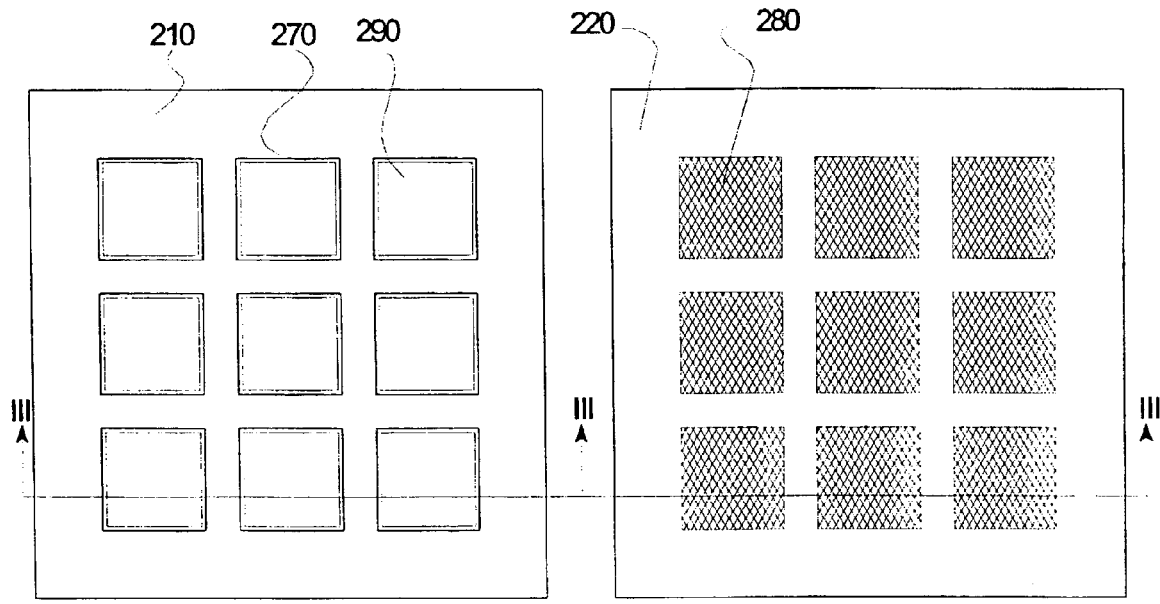
FIGS. 2a, 2b shows the wafers for anodic bonding process according to the invention in plan view.

FIG. 2a is a plane view of lid wafer 210 of glass on which a number of sealing frames 270 of a paste material containing Na-ions are printed, e.g. through screen printing. The frames provide a closed space building the cavities 290. On the other side, i.e. FIG. 2b, functional devices 280 are realised on a Si wafer 220, which can be arranged on a carrying substrate 230 (FIG. 3), which also is provided with bonding frames or sections 270b.

Figure 3:
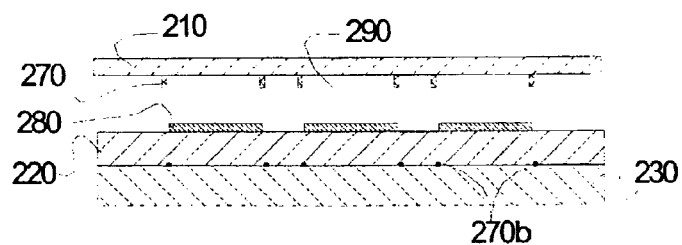
FIG. 3 shows a cross-section along line III—III in FIGS. 2a and 2b, in a preassembled form.

FIG. 3 illustrates the moment before the glass wafer 210 of FIG. 2a is bonded onto the Si wafer 220 of FIG. 2b. After the bonding process packaged units are formed, and each unit is cut out later in a suitable way well known for a skilled person.

In FIG. 3, the functional devices 280 may also be countersunk in the substrate 220 through micro-machining or the like depending on the application and/or the material of the substrate.

The bonding process is performed in a known way, i.e. the Si wafer 220 and the lid glass wafer 210 or carrier 230 are combined and exposed to a pressure and heat up to a specific level, for example 350° C. (not limited) and then a voltage, e.g. 800 V (not limited), is applied through the stack comprising the Si wafer and the lid wafer and/or the carrier.

Figure 4A:
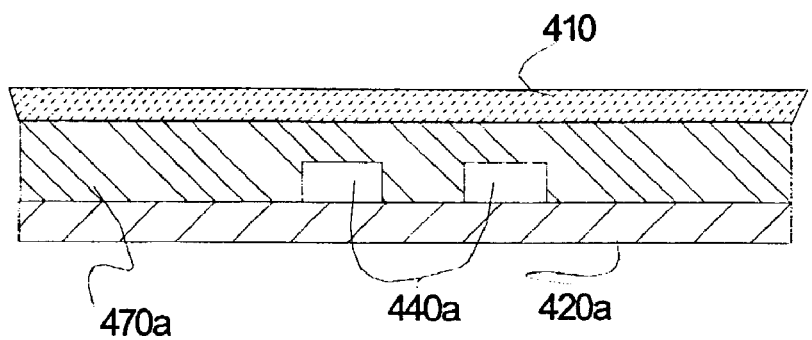
FIGS. 4a, 4b, 4c are cross-sections through different schematic embodiments showing wiring according to the invention.

Here, it is possible to provide different ways of electrical connections out of the functional devices arranged inside the sealed area on the semiconductive material 230: Firstly, according to FIG. 1, i.e. through the carrying substrate 130 and secondly through the sealing frame 270/270b. In the embodiment of FIG. 4a, a substrate 420a is provided with conductors 440a, e.g. through etching or the like. Then the paste 470a (thin film paste) applied onto the glass 410 is pressed on the substrate 420a.

Figure 4B:
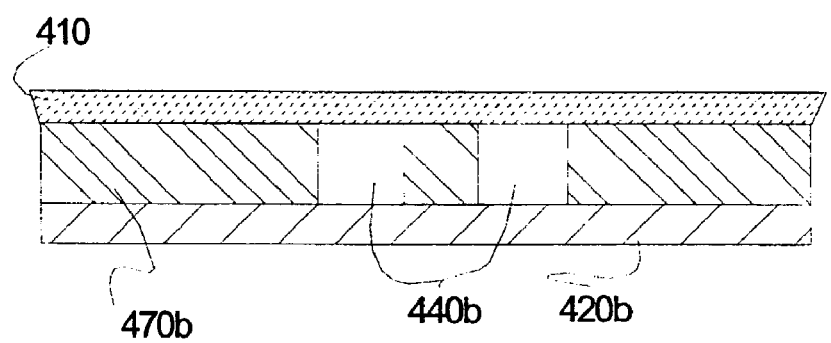

In FIG. 4b a thick-film paste 470b is applied through, e.g. screen printing onto the glass 410. Conductors 440b having substantially the same thickness as the paste are arranged through a suitable method on the substrate 430b, e.g. alumina.

Figure 4C:
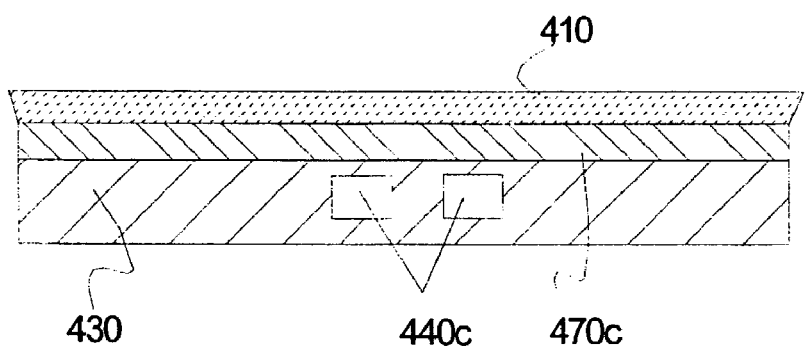

Clearly, other embodiments are also possible as shown in FIG. 4c, in which a substrate 430 of LTCC is used and into which conductors 440c are immersed. Paste 470c is applied onto the glass 410 before bonding.

Figure 5:
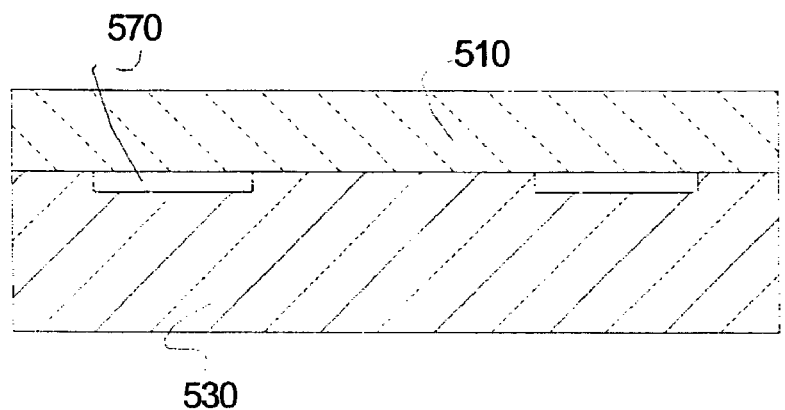
FIG. 5 is a cross-section through yet another embodiment.

As shown in FIG. 5, it is also possible to countersink the pastes 570 into the substrate 530 of LTCC so that the upper surface of the paste comes into a substantially same level as the upper surface of the LTCC. The glass is denoted with 510.

Figure 6:
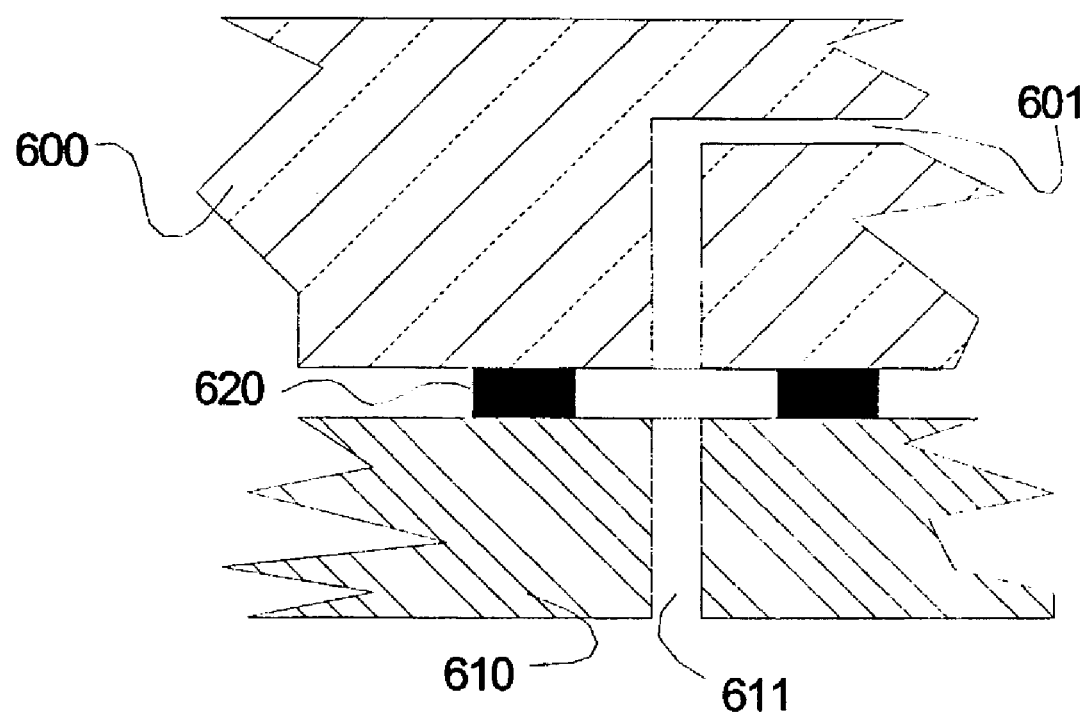
FIG. 6 is a schematic cross-section through a device bonded according to another aspect of the invention.

Additionally, the bonding according to the invention can be used as a sealing in further applications. In FIG. 6, for example, a so-called biological circuit 600 is connected to a substrate 610. The biological circuit comprises a conduit 601 for transporting fluid or gas. It is possible to connect and seal the circuit to an external substrate 610 of, e.g. LTCC of another circuit likewise provided with a conduit 611 using the teachings of the invention, i.e. arranging a ring shaped paste bonding means 620 and anodically bonding the circuit to the substrate or other circuits.

The invention is not limited the shown embodiments but can be varied in a number of ways without departing from the scope of the appended claims and the arrangement and the method can be implemented in various ways depending on application, functional units, needs and requirements etc.

What is claimed is:

1. Method of bonding at least a first member to a second silicon member through anodic bonding, the method comprising the steps of selectively applying a paste on said at least first member at least one bondable section before bringing said first and second members together for anodic bonding.

2. The method according to claim 1, wherein said first member is a glass wafer and said second wafer is a silicon wafer.

3. The method according to claim 2, wherein glass wafer is a borosilicate glass wafer.

4. The method according to claim 1, wherein said first member is a carrier wafer chosen from a group comprising glass, ceramics or glass composite, and said second wafer is a silicon wafer.

5. The method according to claim 1, wherein said paste contains sodium (Na) ions.

6. The method according to claim 5, wherein said glass composite is made of LTCC (Low Temperature Cofired Ceramic).

7. The method according to claim 1, wherein said selective application is provided through one of screen printing or photo image forming.

8. The method according to claim 1, wherein said bonding is hermetical.

9. The method according to claim 1, wherein said first member is arranged as a cover, that said second silicon member is arranged as a carrier for a functional device and said first member bonded to said second member provides a sealing for said functional device.

10. The method according claim 9, wherein a third member is arranged as a carrying member for supporting said second member.

11. The method according claim 10, further comprising arranging electrical connections out of said cover through said third supporting member.

12. The method according claim 10, further comprising arranging said connections through said bonding sections on one of said first, second or third members before applying the bonding paste.

13. The method according claim 9, further comprising arranging electrical connections out of said cover through said bonding sections.

14. The method according to claim 1, wherein said bonding sections are provided on said first member.

15. A sensor comprising a lid, a silicon substrate, a carrying substrate and sensor electronics, wherein said lid, silicon substrate and carrying substrate are bonded using the method according to claim 1.

16. A biological circuit on a substrate manufactured according to claim 1 and including a circuit for transporting a fluid or gas and hermetically connected to said substrate.

17. A method of selectively bonding a first member to a second silicon member through anodic bonding, comprising the steps of:

arranging said first member with a bonding paste in predetermined sections, arranging said first and second members in a contacting position, pressing and heating said first and second members in said contacting positions, and applying a voltage to said first and second members.

18. The method according to claim 17, wherein second member is a silicon wafer comprising one or more active sections.

19. The method according to claim 18, wherein said first member is a glass wafer provided with frames corresponding to said active sections.

* * * * *